(12) United States Patent
Koumura et al.

(10) Patent No.: US 8,013,241 B2
(45) Date of Patent: Sep. 6, 2011

(54) IONIC GEL ELECTROLYTE, DYE-SENSITIZED PHOTOELECTRIC CONVERSION DEVICE AND SOLAR CELL

(75) Inventors: Nagatoshi Koumura, Tsukuba (JP); Koujirou Hara, Tsukuba (JP); Zhong-Sheng Wang, Tsukuba (JP); Masaru Yoshida, Tsukuba (JP); Nobuyuki Tamaoki, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 669 days.

(21) Appl. No.: 12/091,295
(22) PCT Filed: Oct. 16, 2006
(86) PCT No.: PCT/JP2006/320564
§ 371 (c)(1),
(2), (4) Date: Apr. 23, 2008
(87) PCT Pub. No.: WO2007/049477
PCT Pub. Date: May 3, 2007

(65) Prior Publication Data
US 2009/0266419 A1    Oct. 29, 2009

(30) Foreign Application Priority Data
Oct. 24, 2005   (JP) ................................ 2005-307950

(51) Int. Cl.
*H01L 31/00* (2006.01)
*C07D 213/04* (2006.01)
*C07D 295/18* (2006.01)
*C07D 233/00* (2006.01)

(52) U.S. Cl. ........ 136/263; 546/255; 546/309; 546/143; 546/194; 546/291; 544/169; 544/382; 544/211; 544/353; 548/567; 548/338.1; 548/265.4; 548/195

(58) Field of Classification Search ............. 252/301.36; 546/309, 143, 194, 291, 255; 544/169, 382, 544/211, 353; 548/567, 338.1, 265.4, 195; 106/287.2, 287.21; 136/263
See application file for complete search history.

(56) References Cited

FOREIGN PATENT DOCUMENTS

JP   2004-010644   1/2004
(Continued)

OTHER PUBLICATIONS

M. Gratzel. Photoelectrochemical cells. Nature 2001, 414, 338-344.*

(Continued)

*Primary Examiner* — Jennifer K. Michener
*Assistant Examiner* — Carlos Barcena
(74) *Attorney, Agent, or Firm* — Morrison & Foerster LLP

(57) ABSTRACT

Disclosed is a novel ionic liquid gel electrolyte having high photoelectric conversion efficiency. Also disclosed are a novel dye-sensitized photoelectric conversion device using such an ionic liquid gel electrolyte, and a solar cell composed of such a dye-sensitized photoelectric conversion device. Specifically disclosed is an ionic liquid gel electrolyte obtained by gelling a liquid electrolyte by using an ionic organic oligomer gelling agent represented by the general formulae (1) and (2) below. Also specifically disclosed are a dye-sensitized photoelectric conversion device, wherein the ionic liquid gel electrolyte is arranged between a counter electrode and a dye-absorbed semiconductor substrate which is arranged in contact with a transparent conductive substrate, and a solar cell.

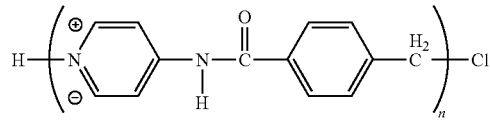

(1)

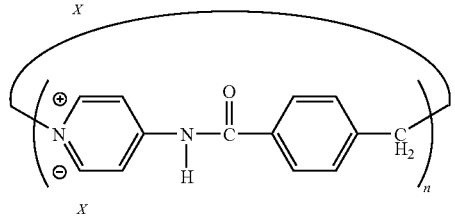

(2)

4 Claims, 1 Drawing Sheet

(a) TRANSPARENT CONDUCTIVE SUBSTRATE
(b) DYE-ABSORBED SEMICONDUCTOR ELECTRODE
(c) QUASI-SOLIDIFIED ELECTROLYTE
   (IONIC LIQUID GEL PREPARED WITH USE OF IONIC ORGANIC OLIGOMER GELLING AGENT)
(d) COUNTER ELECTRODE

FOREIGN PATENT DOCUMENTS

| JP | 2005-093075 | 4/2005 |
|---|---|---|
| WO | WO-2006/082768 A1 | 8/2006 |

OTHER PUBLICATIONS

Barbé, C. J. et al. (1997). "Nanocrystalline Titanium Oxide Electrodes for Photovoltaic Applications," *Journal of the American Ceramic Society* 80(12):3157-3171.

Hara, K. et al. (2003). "Dye-Sensitized Nanocrystalline $TiO_2$ Solar Cells Based on Novel Coumarin Dyes," *Solar Energy Materials & Solar Cells* 77:89-103.

Hara, K. et al. (Feb. 2005). "Novel Conjugated Organic Dyes for Efficient Dye Sensitized Solar Cells," *Advanced Functional Materials* 15(2):246-252.

International Search Report mailed Jan. 16, 2007, for PCT Application No. PCT/JP2006/320564 filed Oct. 16, 2006, 3 pages.

Kubo, W. et al. (2002). "Quasi-Solid-State Dye-Sensitized Solar Cells Using Room Temperature Molten Salts and a Low Molecular Weight Gelator," *Chemical Communications* pp. 374-375.

Kubo, W. et al. (2003). "Photocurrent-Determining Processes in Quasi-Solid State Dye-Sensitized Solar Cells Using Ionic Gel Electrolytes," *Journal of Physical Chemistry B* 107(18):4374-4381.

Nazeeruddin, M. K. et al. (1997). "Redox Regulation in Ruthenium(II) Polypyridyl Complexes and their Application in Solar Energy Conversion," *Dalton Transactions* pp. 4571-4578.

Nazeeruddin, M. K. et al. (2001). "Engineering of Efficient Panchromatic Sensitizers for Nanocrystalline $TiO_2$-Based Solar Cells," *Journal of the American Chemical Society* 123(8): 1613-1624.

U.S. Appl. No. 11/883,462, filed Sep. 28, 2007 for Yoshida et al.

Usui, H. et al. (2004). "Improved Dye-Sensitized Solar Cells Using Ionic Nanocomposite Gel Electrolytes," *Journal of Photochemistry and Photobiology A: Chemistry* 164:97-101.

Wang, P. et al. (2003). "Gelation of Ionic Liquid-Based Electrolytes with Silica Nanoparticles for Quasi-Solid-State Dye-Sensitized Solar Cells," *Journal of the American Chemical Society* 125(5):1166-1167.

\* cited by examiner (a) TRANSPARENT CONDUCTIVE SUBSTRATE
(b) DYE-ABSORBED SEMICONDUCTOR ELECTRODE
(c) QUASI-SOLIDIFIED ELECTROLYTE
(IONIC LIQUID GEL PREPARED WITH USE OF
IONIC ORGANIC OLIGOMER GELLING AGENT)
(d) COUNTER ELECTRODE

IONIC GEL ELECTROLYTE, DYE-SENSITIZED PHOTOELECTRIC CONVERSION DEVICE AND SOLAR CELL

CROSS REFERENCE TO RELATED APPLICATIONS

This application is a U.S. National Phase patent application of International Application No. PCT/JP2006/320564, with an international filing date of Oct. 16, 2006, which claims priority to Japanese Patent Application No. 2005-307950 filed on Oct. 24, 2005, all of which are incorporated herein by reference in their entirety.

TECHNICAL FIELD

The present invention relates to an ionic gel electrolyte, a dye-sensitized photoelectric conversion device, and a solar cell.

BACKGROUND ART

Recently, a dye-sensitized photoelectric conversion device and a solar cell have been attracting attention as a next-generation solar cell. In a solar cell, a solvent is generally used as an electrolyte solvent. An organic solvent is not necessarily practical in view of stability of a cell. Consequently, an ionic liquid with thermal stability and non-volatility is attracting attention as a candidate for an electrolyte solvent. However, there is a problem that a solar cell with an ionic liquid has lower conversion efficiency than a solar cell with an organic solvent.

In a case where an ionic liquid is used as an electrolyte solvent, it is expected that the ionic liquid be quasi-solidified so as to ensure long-term stability of a cell. Examples of a technique for quasi-solidifying the ionic liquid include a chemical gel and physical gel. The chemical gel is a gelling method using a chemical reaction such as formation of a macromolecule compound. The physical gel is a quasi-solidification technique using a non-covalent interaction such as a hydrogen bond and a van der Waals force. Recently, researches on practical use of dye-sensitized solar cells using the chemical gel or the physical gel have been actively made.

Noteworthy is a method for gelling an ionic liquid with use of nanoparticles such as titanium oxide and carbon nanotubes. Researches have been made in order to apply the method to dye-sensitized solar cells (Non-patent Documents 1 and 2 and Patent Document 1)

As an example of application of the physical gel to dye-sensitized solar cells, there has been reported only an ionic liquid gel prepared with use of a low-molecular gelling agent (Non-patent Documents 3 and 4).

However, although a dye-sensitized solar cell including an ionic liquid quasi-solid electrolyte prepared with use of a low-molecular gelling agent realizes relatively excellent stability of a cell, conversion efficiency of such dye-sensitized solar cell is 5%, which is much lower than that of a system including an electrolyte made of an organic solvent. The reason is supposed to be prevention of ionic conduction by quasi-solidification.

Further, there is a case where iodine, lithium iodide, t-butylpyridine etc. is added in order to increase conversion efficiency of a solar cell. However, such addition greatly drops gelling ability of a low-molecular gelling agent. In fact, there is no example in which an ionic liquid electrolyte to which lithium iodide or t-butylpyridine is added is gelled with use of a low-molecular gelling agent. As described above, there is no suitable low-molecular gelling agent, which is supposed to be one reason why conversion efficiency of a solar cell is not increased.

Patent Document 1: Japanese Unexamined Patent Publication No. Tokukai 2005-93075
Non-patent Document 1: Wang et al., J. Am. Chem. Soc., 2003, 125, 1166
Non-patent Document 2: Usui et al., J. Photochem. PhotobioL. A: Chem., 2004, 164, 97;
Non-patent Document 3: Kubo et al., Chem. Commun., 2002, 374;
Non-patent Document 4: J. Phys. Chem. B, 2003, 107, 4374

DISCLOSURE OF INVENTION

Object to be Solved by the Invention

An object of the present invention is to provide an ionic liquid gel electrolyte obtained with use of a new gelling agent, a new dye-sensitized photoelectric conversion device including the ionic liquid gel electrolyte, and a solar cell including the new dye-sensitized photoelectric conversion device, each of which solves a problem that an ionic liquid gel electrolyte that is quasi-solidified (gelled) with use of a physical gelling agent made of a conventional and publicly known low-molecular gelling agent has low photoelectric conversion efficiency.

Means to Solve the Problems

The inventors of the present invention have diligently studied in order to solve the foregoing problem and found the followings, and thus completed the present invention. (1) The gelling agent made of the new oligomer is a mixture of a linear (non-circular) compound represented by the following formula (1) and a circular multimeric compound represented by the following formula (2). (2) The oligomer has, as seen from its chemical formulae, a structure in which X is positioned on a nitrogen atom of pyridinium. In this case, it was found that a liquid electrolyte obtained by gelling a liquid electrolyte with use of a gelling agent including the oligomer exhibited excellent ion conductivity.

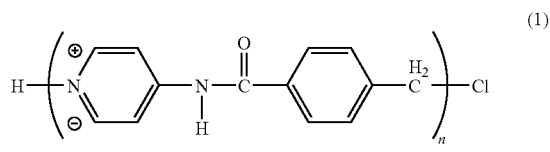

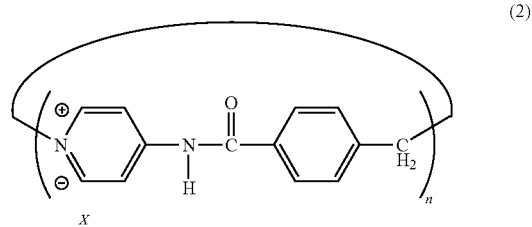

wherein n is an integer of 2 to 30 and X is one atom or ion selected from a halogen atom, a tetrafluoroborate group ($BF_4$), a hexafluorophosphate group ($PF_6$), bis(trifluoromethanesulfonyl)imide, thiocyanate (SCN), a nitrate group ($NO_3$), a sulfate group ($SO_4$, ½ equivalent) and a phosphate group ($PO_4$, ⅓ equivalent);

(3) The inventors found that by applying the liquid electrolyte obtained by gelling a liquid electrolyte with use of the gelling agent to a dye-sensitized photoelectric conversion device, it was possible to increase photoelectric conversion efficiency. Further, the inventors found that a solar cell including the dye-sensitized photoelectric conversion device exhibited higher photoelectric conversion efficiency of solar energy.

The present invention resulting from the above new findings are as follows.

(1) An ionic liquid gel electrolyte, obtained by gelling a liquid electrolyte with use of a gelling agent including an oligomer represented by formulae (1) and (2):

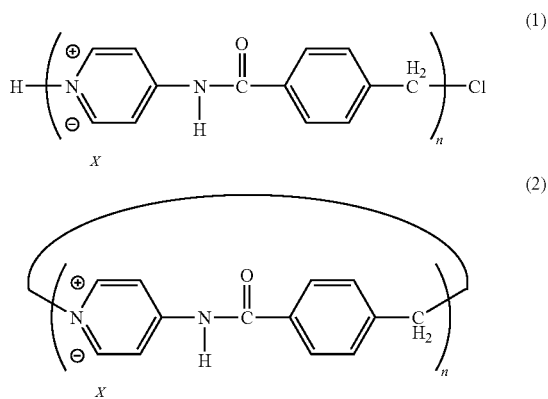

wherein n is an integer of 2 to 30 and X is one atom or ion selected from a halogen atom, a tetrafluoroborate group ($BF_4$), a hexafluorophosphate group ($PF_6$), bis(trifluoromethanesulfonyl)imide, thiocyanate (SCN), a nitrate group ($NO_3$), a sulfate group ($SO_4$, ½ equivalent) and a phosphate group ($PO_4$, ⅓ equivalent);

(2) The ionic liquid gel electrolyte according to (1), wherein the liquid electrolyte is made of an electrolyte containing a redox ion-pair and an electrolyte solvent containing an ionic liquid.

(3) A dye-sensitized photoelectric conversion device, including:
(a) a transparent conductive substrate;
(b) a dye-adsorbed semiconductor electrode in contact with the transparent conductive substrate;
(c) an ionic liquid gel electrolyte according to (1) or (2) in contact with the dye-adsorbed semiconductor electrode; and
(d) a counter electrode in contact with the ionic liquid gel electrolyte.

(4) A solar cell, including a dye-sensitized photoelectric conversion device according to (3).

EFFECT OF THE INVENTION

The liquid gel electrolyte of the present invention exhibits excellent ion conductivity. That is, the liquid gel electrolyte is quasi-solidified (gelled) while maintaining a state of an ionic liquid, and exhibits excellent ion conductivity.

Applying the liquid gel electrolyte to a dye-sensitized photoelectric conversion device allows an increase in photoelectric conversion efficiency. In the liquid gel electrolyte, gelation of a liquid electrolyte with use of a physical gelling agent including oligomer was observed. This indicates that there is a possibility that conversion efficiency can be further increased by changing and optimizing a composition of an electrolyte (composition such as the kinds of an ionic liquid and concentration of a gelling agent).

A solar cell including the dye-sensitized photoelectric conversion device has higher photoelectric conversion efficiency of solar energy.

Figure 1:
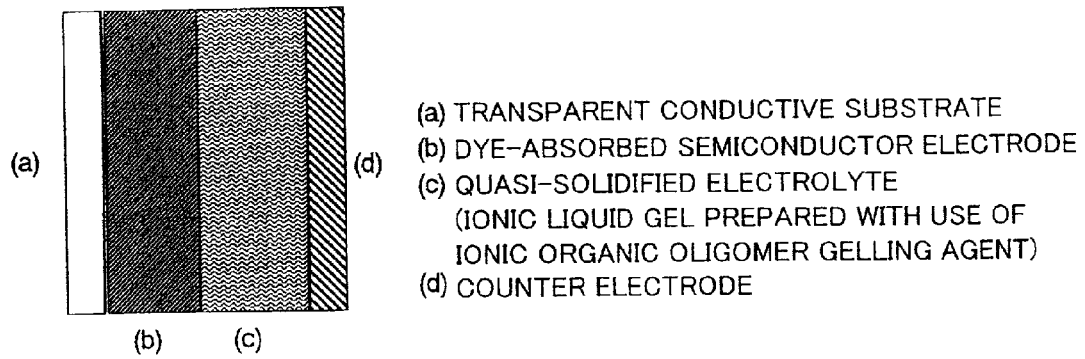
FIG. 1 is a drawing illustrating a structure of a quasi-solid dye-sensitized photoelectric conversion device.
Figure 2:
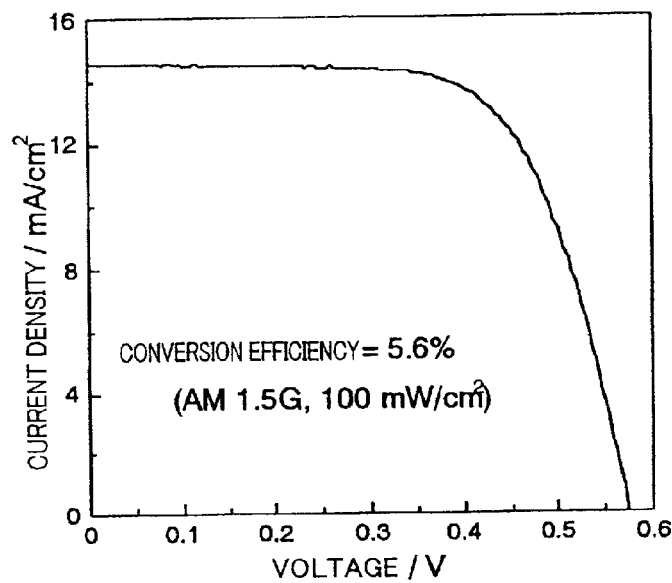
FIG. 2 is an example of photoelectric current voltage characteristics of a quasi-solid dye-sensitized photoelectric conversion device in Examples.

EXPLANATION OF REFERENCES a: transparent conductive substrate
b: dye-absorbed semiconductor electrode
c: ionic liquid gel electrolyte
d: counter electrode

BEST MODE FOR CARRYING OUT THE INVENTION

A gelling agent used in the present invention is an ionic organic oligomer gelling agent mixture represented by formulae (1) and (2).

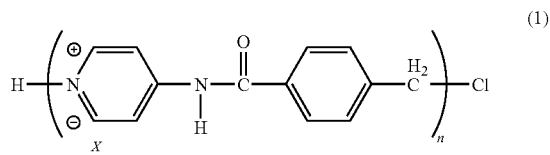

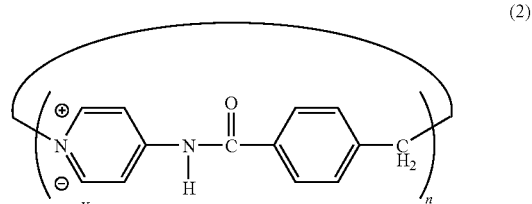

wherein n is an integer of 2 to 30 and X is one atom or ion selected from a halogen atom, a tetrafluoroborate group ($BF_4$), a hexafluorophosphate group ($PF_6$), bis(trifluoromethanesulfonyl)imide, thiocyanate (SCN), a nitrate group ($NO_3$), a sulfate group ($SO_4$, ½ equivalent) and a phosphate group ($PO_4$, ⅓ equivalent).

The halogen atom is selected from Cl, Br, I, and F.

A method for producing the ionic organic oligomer include the steps of: performing condensation polymerization of 4-aminopyridine and chloromethyl benzoyl chloride, involving amidation and methylation of a pyridine ring; and performing an anion exchange reaction.

A liquid electrolyte is made of an electrolyte containing a redox ion pair and an electrolyte solvent containing an ionic liquid.

The electrolytic solution includes a redox ion pair as an electrolyte.

Specific examples of the redox ion pair include $I^-/I_3^-$, $Br^-/Br_2$, $Fe^{2+}/Fe^{3+}$, $Sn^{2+}/Sn^{4+}$, $Cr^{2+}/Cr^{3+}$, $V^{2+}/V^{3+}$, $S^{2-}/S_2^{2-}$, and anthraquinone.

In a case where the redox ion pair is iodine redox, there is used a mixture of iodine and one of imidazolium derivative (such as dimethylpropylimidazolium iodide), lithium iodide, potassium iodide, and tetraalkylammonium iodide, each including the above ion.

In a case where the redox ion pair is bromine redox, there is used a mixture of bromide and one of lithium bromide, potassium bromide, and tetraalkylammonium bromide, each including the above ion. Lithium iodine, tetraalkylammonium, and imidazolium iodide derivative that are iodine redox are preferable.

Concentration of a redox electrolyte of a liquid electrolyte generally ranges from 0.05 to 1M, preferably ranges from 0.1 to 0.5M. When the concentration is less than 0.05M, the concentration is not sufficiently high, resulting in an unsatisfactory effect. When the concentration is more than 1M, a specific effect cannot be expected.

An electrolyte solvent is used to dissolve a redox electrolyte.

An ionic liquid is used as the electrolyte solvent. The ionic liquid is not particularly limited. An example of the ionic liquid is a room temperature molten salt that has a liquid form at room temperature and that includes as cations a compound including quaternary nitrogen atoms. Examples of the cations include derivatives of imidazolium, pyridinium, and ammonium. Examples of anions include halogen ion, tetrafluoroborate ion, hexafluorophosphate ion, bis(trifluoromethylsulfonyl)imide ion. Specific examples include ionic liquids such as 1-n-propyl-3-methylimidazolium iodide, 1-n-hexyl-3-methylimidazolium iodide, 1-n-octyl-3-methylimidazolium iodide, and mixture solvents thereof.

In producing an ionic liquid gel electrolyte, a redox ion pair (e.g. $I^-/I_3^-$, $Br^-/Br_2$, $Fe^{2+}/Fe^{3+}$, $Sn^{2+}/Sn^{4+}$, $Cr^{2+}/Cr^{3+}$, $V^{2+}/V^{3+}$, $S^{2-}/S_2^{2-}$, and anthraquinone) is added as an electrolyte to the electrolyte solvent made of the ionic liquid in such a manner that the concentration of the electrolyte is in the aforementioned range. Thus, the resultant is quasi-solidified (gelled).

In order to enhance photoelectric conversion characteristics, a basic additive such as a pyridine derivative (e.g. t-butylpyridine) may be added to the redox electrolytic solution. Concentration of the additive in the electrolytic solution at that time generally ranges from 0.05 to 1M, preferably from 0.1 to 0.5M.

FIG. 1 illustrates a structure of a dye-sensitized photoelectric conversion device of the present invention. The following explains the dye-sensitized photoelectric conversion device with reference to FIG. 1.

A dye-absorbed semiconductor electrode (b) is provided in contact with a transparent conductive substrate (a). An ionic liquid gel electrolyte (c) is provided between the dye-absorbed semiconductor electrode (b) and a counter electrode (d).

An oxide semiconductor thin film is used as a transparent conductive material of the transparent conductive substrate (a). A doped oxide is used as the oxide semiconductor. Specific examples of the doped oxide include fluorine-doped or antimony-doped tin oxide (NESA), tin-doped indium oxide (ITO), and aluminum-doped zinc oxide.

Glass or plastic is used for a substrate of the transparent conductive substrate (a).

The transparent conductive substrate is obtained by coating a surface of the substrate with a conductive transparent oxide semiconductor thin film that is the transparent conductive material.

The transparent conductive substrate (a) may be a combination of the oxide semiconductor thin film and the material mentioned above as an example of the substrate. A preferable combination is a glass coated with a fluorine-doped tin oxide thin film.

The semiconductor thin film electrode (b) is made of a composite semiconductor that is made of nanoparticles and that has a nanoporous structure (structure whose pore diameter is in nano level). A semiconductor used for the semiconductor thin film is not particularly limited as long as it has properties of a semiconductor. Specific examples of the semiconductor include: metal oxides and complex oxides such as $TiO_2$, $ZnO$, $In_2O_3$, $SnO_2$, $Bi_2O_3$, $ZrO_2$, $Ta_2O_5$, $Nb_2O_5$, $WO_3$, $Fe_2O_3$, $Ga_2O_3$, and $SrTiO_3$; metal halides such as $AgI$, $AgBr$, $CuI$, and $CuBr$; metal sulfides such as $ZnS$, $TiS_2$, $In_2S_3$, $Bi_2S_3$, $CdS$, $ZrS_2$, $TaS_2$, $Ag_2S$, $Cu_2S$, $SnS_2$, $WS_2$, and $MoS_2$; and metal selenides and tellurides such as $CdSe$, $CdTe$, $ZrSe_2$, $ZeSe$, $TiSe_2$, $Bi_2Se_3$, $In_2Se_3$, $WSe_2$, $WTe_2$, $MoSe_2$, and $MoTe_2$. Among them, titan dioxide, zinc oxide, and tin oxide are preferable.

In a case of using titan oxide particles, commercial products such as P25 (Degussa or NIPPON AEROSIL CO., LTD.) and ST-01 (ISHIHARA SANGYO KAISHA LTD.) may be used. Further, as described in J. Am. Ceram. Soc., 1997, 80, 3157, crystalline titan oxide particles obtained from titan alcoxide etc. via hydrolysis, autoclaving etc. through a sol-gel method may be used. It is preferable to use titan oxide particles obtained from titan alcoxide through the sol-gel method.

Particle diameter of a semiconductor nanoparticle constituting the semiconductor thin film ranges from 8 to 1000 nm, preferably from 10 to 300 nm.

A method for forming an oxide semiconductor thin film electrode is not particularly limited as long as the method allows forming a thin film when forming an electrode. Specific examples include the following two methods:

(1) Oxide semiconductor nanoparticles are mixed with water, polymers that are binders, and a surfactant in order to obtain slurry. The slurry is applied on a substrate through a doctor-blade method.

(2) Polymers that are binders are mixed with an organic solvent, and the resultant is applied on a substrate through a screen printing method.

In either method, an example of a polymer is polyethyleneglycol.

The oxide semiconductor thin film substrate thus formed is sintered in the air or in oxygen atmosphere at approximately 450 to 500° C. As a result, an oxide semiconductor thin film electrode can be obtained.

The oxide semiconductor thin film electrode has a porous structure in which nanoparticles (nanoporous structures) are laminated. The real surface area of the electrode is 1 to 10000 times larger, preferably 100 to 3000 times larger, than the seeming surface area thereof.

Further, for example, there may be used an electrode obtained by forming an oxide semiconductor thin film electrode on a substrate with a wide surface area, such as a substrate obtained by micro-fabricating a smooth substrate so that a lod-like high surface structure with a high aspect ratio is formed on the substrate, and a substrate on which random concaves and convexes are formed.

In this case, too, the real surface area of the electrode is 1 to 10000 times larger, preferably 100 to 3000 times larger, than the seeming surface area thereof.

The thickness of the semiconductor thin film electrode generally ranges from 2 to 100 μm, and preferably from 5 to 20 μm.

When the thickness is less than 2 μm, an original effect cannot be expected. On the other hand, when the thickness is more than 100 μm, a specific effect cannot be obtained.

Examples of the dye to be absorbed in the surface of the semiconductor thin film electrode include (1) a metal complex having an absorption in ultraviolet, visible, and near-infrared regions of light and (2) an organic dye having an absorption in ultraviolet, visible, and near-infrared regions of light.

Specific examples of a compound for the (1) metal complex having an absorption in ultraviolet, visible, and near-infrared regions of light include compounds represented by the following chemical formulae. However, in the present invention, the metal complex having an absorption in ultraviolet, visible, and near-infrared regions of light is not limited to these examples.

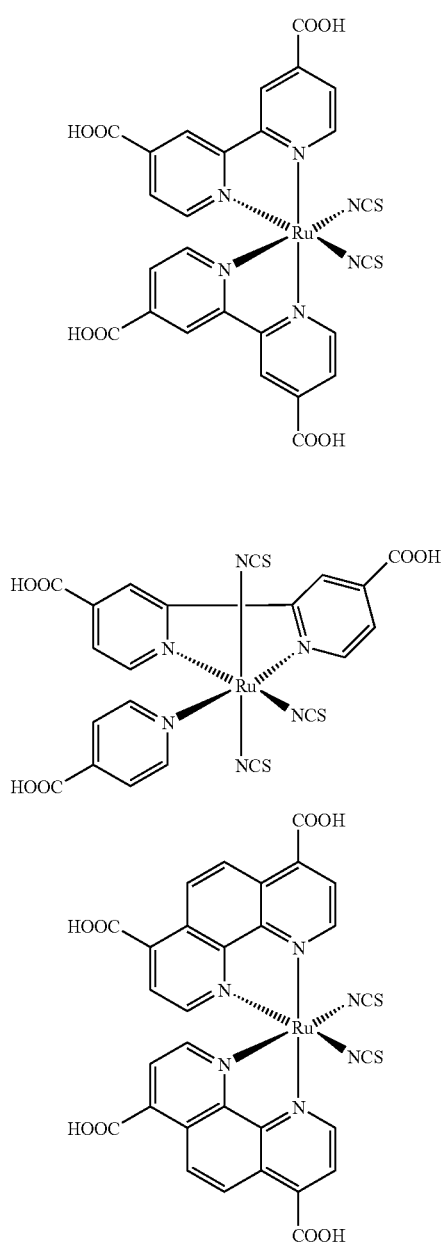

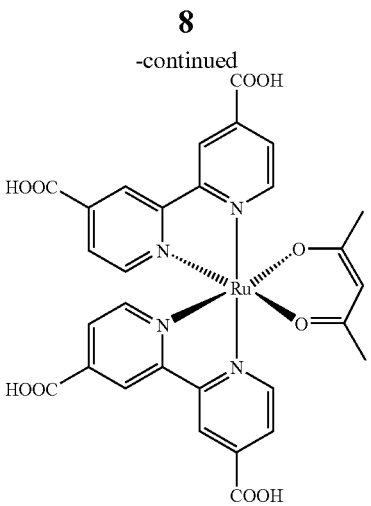

The methods for synthesizing the above metal complexes are described in Non-patent Document 5: Nazeeruddin et al. J. Chem. Soc., DaLton Trans. 1997, 4571, Non-patent Document 6: Nazeeruddin et al. J. Am. Chem. Soc., 2001, 123, 1613, etc.

Examples of the (2) dye to be absorbed in the surface of the semiconductor thin film substrate include organic dyes having an absorption in ultraviolet, visible, and near-infrared regions of light, and mixtures thereof.

Specific examples of the compound for the dye are as follows. However, in the present invention, the compound is not limited to these examples.

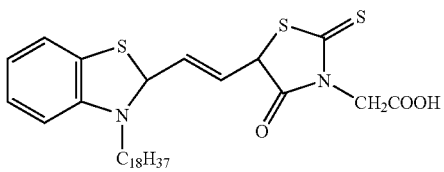

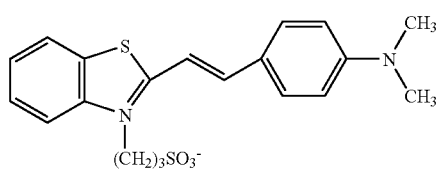

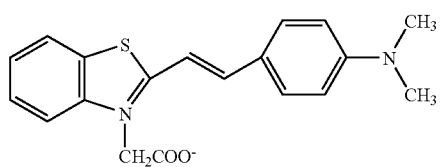

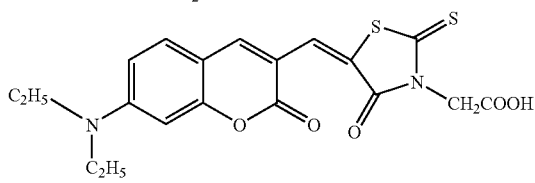

-continued

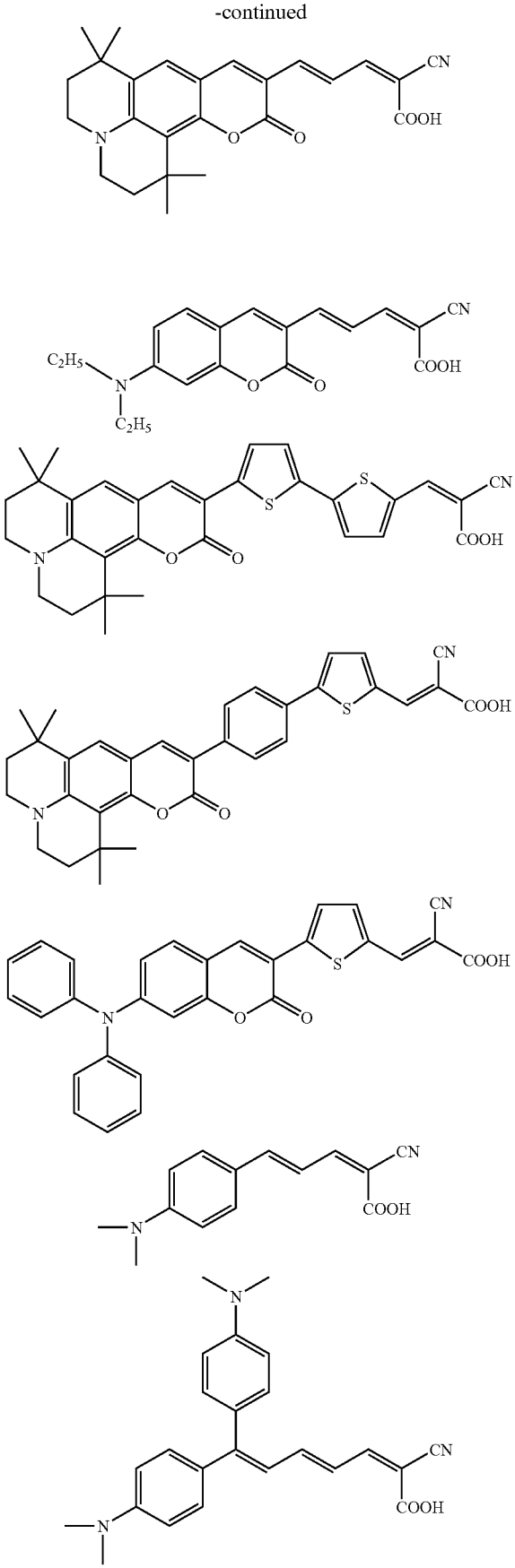

-continued

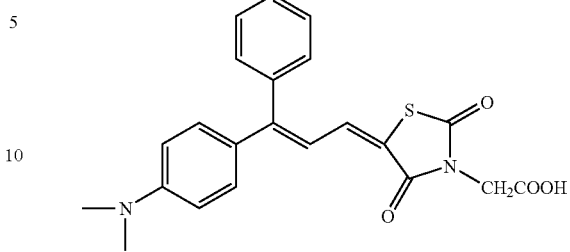

The methods for synthesizing the above organic dyes are described in Non-patent Document 7: K. Hara et al., SoL. Energy Mater. SoL. CeLLs. 2003, 77, 89, Non-patent Document 8: K. Hara et al., Adv Funct. Mater., 2005, 15, 246 etc.

The dye or the organic dye made of the above metal complex is absorbed in the surface of the semiconductor electrode by way of chemical bonds such as a metal bond, an ionic bond, and a covalent bond, or by way of a physical bond.

The dye includes an acceptor site and a donor site each for the absorption. Both of or one of the acceptor site and the donor site serve as an anchor group containing an unpaired electron. Any anchor group can be used as long as it contains an unpaired electron when forming a bond.

Examples of the unpaired electron include an unpaired electron of a COOH group, a $CH_2COOH$ group, a NCS group, an OH group, or an SH group.

The method for causing the dye to be absorbed in the surface of the semiconductor electrode is as follows. The electrode is immersed in a dye solution for 1 minute to 3 days at room temperature, or for 1 minute to 24 hours while being heated. It is preferable to immerse the dye for 12 to 24 hours at room temperature.

A solvent used in causing the dye to be absorbed in the nanoporous electrode is not particularly limited as long as the solvent dissolves the dye. Examples of the solvent include: alcohol solvents such as methanol, ethanol, isopropanol, and t-butanol; carbon hydride solvents such as benzene, chlorobenzene, dichlorobenzene, dichloromethane, chloroform, and hexane; organic solvents such as tetrahydrofuran and acetonitrile; and mixtures thereof. However, the solvent is not limited to these examples. Preferable examples of the solvent include ethanol and a mixture of t-butanol and acetonitrile.

Concentration of organic molecules in the solution used in causing the dye to be absorbed in the nanoporous electrode ranges from 0.01 mM to a saturated amount, and preferably from 0.1 to 0.5 mM.

The following explains a counter electrode.

Platinum is used as a metal for the counter electrode.

Platinum is fixed on a FTO glass substrate to form the counter electrode. A method for fixing platinum may be suitably used as long as it is a method for fixing a metal on a surface of a glass substrate. Examples of the method include sputtering.

By causing the dye-sensitized photoelectric conversion device to operate in the presence of light such as sunlight, the device serves as a solar cell.

The following describes Examples of the present invention. However, the present invention is not limited to these Examples. In order to check the effect of the present invention, an electromotive force was measured with use of an AM1.5 solar simulator and a source meter.

In the following, the present invention is further specifically explained with reference to Examples. However, the present invention is not limited to these Examples.

Example 1

Synthesizing Example 1

Oligomer Represented by Formulae (1) and (2) in which Anions are Iodine

Ionic organic oligomer was produced as follows. 4.27 g of 4-aminopyridine and 8.34 g of 4-(chloromethyl)benzoyl chloride were mixed with each other in 100 mL of dry dichloromethane in the presence of 6.95 mL of triethylamine, and the resultant was stirred at room temperature for one night. Consequently, white precipitate was produced. The white precipitate was filtered to obtain 9.51 g of ionic organic oligomer whose X was a chloride anion. The yield of the ionic organic oligomer was 85%.

20 mL of water was added to 150 mL of white power thus obtained, the resultant was heated so that the white powder was dissolved completely. To the solution was added 20 mL of an aqueous solution of 8.81 g of ammonium iodide under heating and reflux, and the resultant was subjected to heating and reflux for 10 minutes. Thereafter, the reacting solution was cooled down to room temperature to deposit a yellowish solid. The yellowish solid was filtered to obtain 192 mg of ionic organic oligomer whose anion was an iodide ion, which was a target object. The yield of the ionic organic oligomer was 93%.

Example 2

Formation of Transparent Conductive Substrate

A paste containing $TiO_2$ nanoparticles, of 10 to 30 nm in thickness, was screen-printed on a fluorine-doped $SnO_2$-coated transparent conductive glass substrate (hereinafter referred to as FTO glass substrate), and the resultant was sintered at 500° C. to obtain a nanoporous $TiO_2$ thin film electrode of approximately 6 nm in thickness. The $TiO_2$ electrode was immersed in an ethanol solution containing Ru N719 dye for 24 hours so that the dye was absorbed in the $TiO_2$ surface.

Example 3

Formation of Dye-Sensitized Photoelectric Conversion Device and Solar Cell

There was prepared a sealed cell made of a dye-absorbed $TiO_2$ electrode, a counter electrode obtained by sputtering Pt on a FTO glass substrate, and a spacer (thermocompression resin). The ionic liquid gel electrolyte in Example 1 that was separately prepared (ionic liquid gel electrolyte obtained by causing a gelling agent that was organic oligomer whose anion was an iodide ion to be dissolved at high temperature in 1-n-propyl-3-methylimidazolium iodide (containing 10% of water) containing 0.3M of iodine, 0.05M of lithium iodide, and 0.1M of t-butylpyridine so that concentration of the gelling agent was 40 g/L) was poured into the cell in a high temperature condition (approximately 120° C.) before the gelation began. Then, the cell was cooled down and thus a gelled electrolyte cell was prepared.

Under irradiation of light with AM1.5G (100 mW/cm$^2$), the current-voltage characteristic of the cell was measured. The result of the measurement showed that conversion efficiency of solar energy was 5.6%.

The invention claimed is:

1. An ionic liquid gel electrolyte, obtained by gelling a liquid electrolyte with use of a gelling agent including an oligomer represented by formulae (1) and (2):

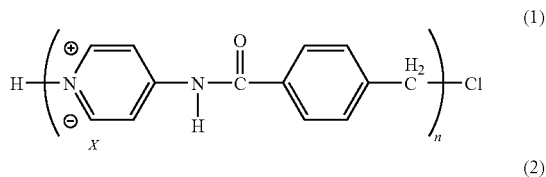

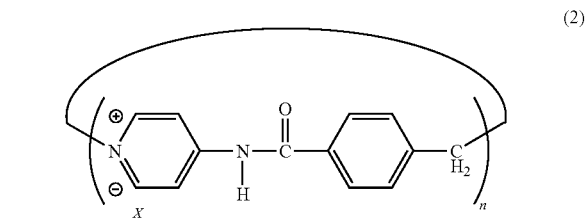

wherein n is an integer of 2 to 30 and X is one atom or ion selected from a halogen atom, a tetrafluoroborate group ($BF_4$), a hexafluorophosphate group ($PF_6$), bis(trifluoromethanesulfonyl)imide, thiocyanate (SCN), a nitrate group ($NO_3$), a sulfate group ($SO_4$, ½ equivalent) and a phosphate group ($PO_4$, ⅓ equivalent).

2. The ionic liquid gel electrolyte according to claim 1, wherein the liquid electrolyte is made of an electrolyte containing a redox ion-pair and an electrolyte solvent containing an ionic liquid.

3. A dye-sensitized photoelectric conversion device, comprising:
  (a) a transparent conductive substrate;
  (b) a dye-adsorbed semiconductor electrode in contact with the transparent conductive substrate;
  (c) an ionic liquid gel electrolyte according to claim 1 in contact with the dye-adsorbed semiconductor electrode; and
  (d) a counter electrode in contact with the ionic liquid gel electrolyte.

4. A solar cell, comprising a dye-sensitized photoelectric conversion device according to claim 3.

* * * * *